United States Patent
Chiku et al.

(10) Patent No.: US 10,026,529 B2
(45) Date of Patent: Jul. 17, 2018

(54) SHUNT RESISTOR

(71) Applicant: KOA CORPORATION, Ina-shi, Nagano (JP)

(72) Inventors: Satoshi Chiku, Ina (JP); Takanori Kikuchi, Ina (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 15/029,529

(22) PCT Filed: Oct. 3, 2014

(86) PCT No.: PCT/JP2014/076602
§ 371 (c)(1),
(2) Date: Apr. 14, 2016

(87) PCT Pub. No.: WO2015/060108
PCT Pub. Date: Apr. 30, 2015

(65) Prior Publication Data
US 2016/0240288 A1    Aug. 18, 2016

(30) Foreign Application Priority Data

Oct. 22, 2013   (JP) .................................. 2013-219209

(51) Int. Cl.
*H01C 1/14* (2006.01)
*H01C 1/04* (2006.01)
(Continued)

(52) U.S. Cl.
CPC ................. *H01C 1/14* (2013.01); *H01C 1/04* (2013.01); *H01C 13/00* (2013.01); *H01C 17/22* (2013.01); *H01C 17/245* (2013.01)

(58) Field of Classification Search
CPC .......... H01C 1/14; H01C 13/00; G01R 15/14; G01R 15/146
(Continued)

(56) References Cited

U.S. PATENT DOCUMENTS 4,498,071 A * 2/1985 Plough, Jr. ............. H01C 7/006
  204/192.21
7,053,749 B2 * 5/2006 Ishida .................... H01C 1/144
  338/323
(Continued)

FOREIGN PATENT DOCUMENTS

CN    1457496 A     11/2003
JP    06-267707    * 10/1993 ............... H01C 7/00
(Continued)

OTHER PUBLICATIONS

Search Report, and English language translation thereof, in corresponding International Application No. PCT/JP2014/076602, dated Dec. 22, 2014, 5 pages.
(Continued)

*Primary Examiner* — Kyung Lee
*Assistant Examiner* — Iman Malakooti
(74) *Attorney, Agent, or Firm* — Brinks Gilson & Lione

(57) ABSTRACT

A resistive element including a main body portion, and first and second terminal portions with different shapes that are provided at opposite ends of the main body portion in the long-side direction. At least one side portion of the main body portion in the short-side direction has a protruding portion.

7 Claims, 9 Drawing Sheets

(51) Int. Cl.
*H01C 13/00* (2006.01)
*H01C 17/22* (2006.01)
*H01C 17/245* (2006.01)

(58) Field of Classification Search
USPC .................................. 338/49, 322, 328, 333
See application file for complete search history.

(56) References Cited

U.S. PATENT DOCUMENTS

| | | | |
|---|---|---|---|
| 2003/0156008 A1 | 8/2003 | Nakanishi et al. | |
| 2004/0012480 A1* | 1/2004 | Nakamura | H01C 17/242 338/328 |
| 2004/0252009 A1* | 12/2004 | Tsukada | H01C 1/144 338/309 |
| 2013/0120104 A1* | 5/2013 | Li | H01C 7/06 338/333 |

FOREIGN PATENT DOCUMENTS

| | | | | |
|---|---|---|---|---|
| JP | H06-267707 A | | 9/1994 | |
| JP | H11-111504 A | | 4/1999 | |
| JP | 2002-048821 | * | 2/2000 | ............ G01R 15/14 |
| JP | 2002-48821 A | | 2/2002 | |
| JP | 2012-233706 A | | 11/2012 | |

OTHER PUBLICATIONS

Office Action, and English language translation thereof, in corresponding Chinese Application No. 201480058414.8, dated Feb. 23, 2018, 12 pages.

Office Action, and English language translation thereof, in corresponding Japanese Application No. 2013-219209, dated Mar. 27, 2018, 6 pages.

* cited by examiner

Fig. 6B(a) (T1)
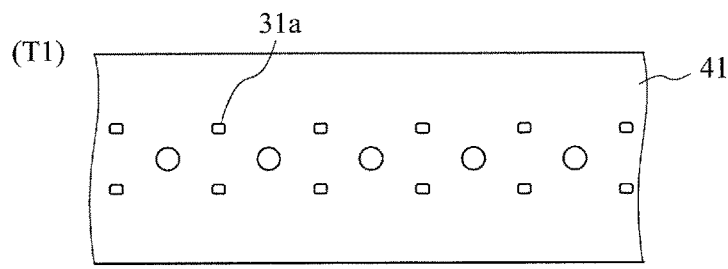
Fig. 6B(b) (T3)
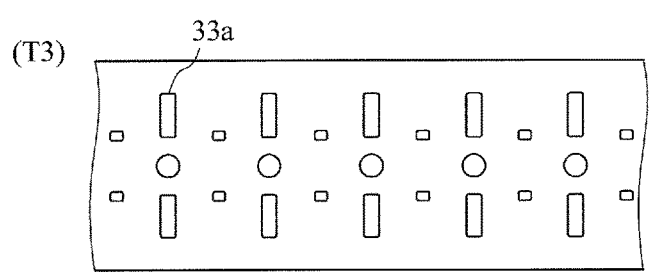
Fig. 6B(c) (T5)
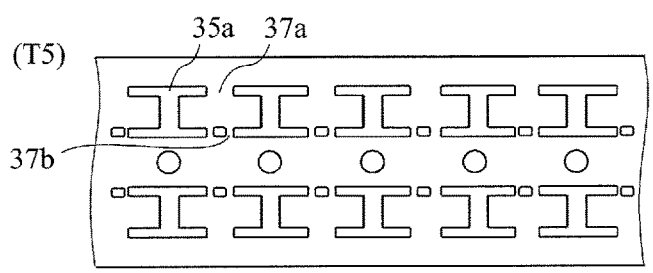
Fig. 6B(d) (T8)
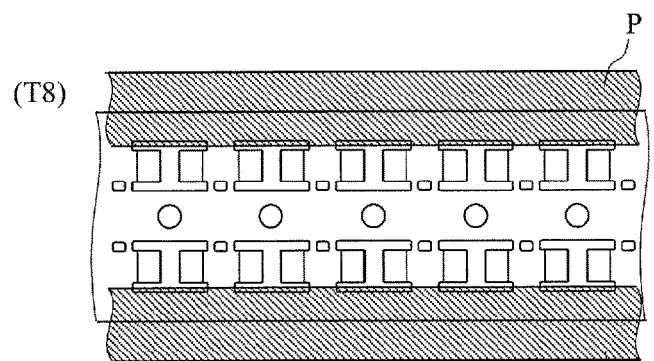
Fig. 6B(e) (T9)
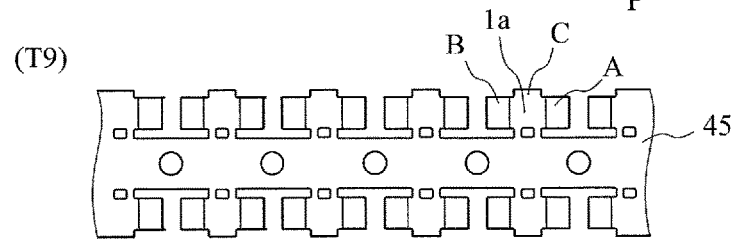

SHUNT RESISTOR

This application is a 371 application of PCT/JP2014/076602 having an international filing date of Oct. 3, 2014, which claims priority to JP 2013-219209 filed Oct. 22, 2013. The entire contents of the two applications are incorporated herein by reference.

TECHNICAL FIELD

The present invention relates to a resistive element and a method for manufacturing the same.

BACKGROUND ART

In recent years, the number of ECUs (Electronic Control Units) mounted for controlling an engine, an air conditioner, and the like has been increasing with the progress of technologies for electrifying components in automobiles and the like. Therefore, a reduction in size of the ECU is demanded. Since using a planar mounted structure has a limitation in reducing the size, a three-dimensionally mounted structure has been adopted.

Among shunt resistors, there is known a method of solder-mounting a shunt resistor on a PCB and detecting electrical characteristics using pseudo-Kelvin terminals that are formed on wiring patterns of the PCB. Meanwhile, there has been studied a method for reducing the size of an ECU by solder-mounting a shunt resistor on a PCB and connecting wires to upper faces of terminals of the shunt resistor through wire bonding to detect electrical characteristics (for example, see Patent Literature 1).

CITATION LIST

Patent Literature

Patent Literature 1: JP 2012-233706 A

SUMMARY OF INVENTION

Technical Problem

By the way, substrate wires (lands) on which a shunt resistor is mounted may have a difference in height therebetween that has been produced to attempt a reduction in size. In order to mount a shunt resistor on such non-flush lands, it is necessary to form two terminals, which are to be bonded to the lands, of the shunt resistor in accordance with the difference in height of the lands, for example.

In such a case, as the two terminals have different structures, it is necessary to mount the shunt resistor such that it is oriented with respect to the positions of the terminals. However, as the shunt resistor is small, it is not easy to check the orientation of the shunt resistor only from the difference (difference in height) of the three-dimensional structures of the terminals.

In addition, in order to detect current, a shunt resistor is required to have more precise characteristics.

It is an object of the present invention to provide a technique that can easily check the orientation of terminals of a resistive element such as a shunt resistor.

Solution to Problem

According to an aspect of the present invention, there is provided a resistive element including a main body portion and first and second terminal portions provided at opposite ends of the main body portion. At least one side portion of the main body portion has a characteristic shape such as a protruding portion.

With the protruding portion, the resistive element is allowed to be a jumper element or a resistive element whose directionality of the terminal portions (i.e., in the long-side direction) can be identified.

The opposite side portions of the main body portion have a first protruding portion and a second protruding portion, respectively, and the first protruding portion and the second protruding portion have different (characteristic) shapes.

As the first protruding portion and the second protruding portion are formed to have different characteristic shapes seen from above, for example, the directionality of the terminal portions (in the long-side direction) can be identified more easily.

Further, the resistive element includes a covering material that covers a metal material of the main body portion.

One of an end portion of the first protruding portion or an end portion of the second protruding portion is not covered with the covering material.

According to another aspect of the present invention, there is provided a method for manufacturing a resistive element, the resistive element including a main body portion, first and second terminal portions provided at opposite ends of the main body portion, and a protruding portion provided at least on one side portion of the main body portion, the method including preparing a sheet-like or hoop-like plate-shaped body made of a metal material; forming a hole for defining a peripheral shape of the terminal portions in the plate-shaped body, and forming a first coupled portion that is coupled to the plate-shaped body on a side portion of the main body portion; and cutting the main body portion at the first coupled portion, thereby forming the protruding portion on the side portion of the main body portion.

Herein, the method further includes adjusting a resistance value of the main body portion by adjusting an amount of protrusion of the protruding portion, the amount of protrusion being dependent on a cut position at the first coupled portion.

The main body portion has a second coupled portion formed on another side portion thereof, and the method further includes cutting the main body portion at the second coupled portion.

Herein, the second coupled portion has at least one hole formed therein in advance, and the method further includes cutting the main body portion at a portion where the hole of the second coupled portion is formed, thereby forming a plurality of protruding portions on the other side portion of the main body portion.

The present specification incorporates the content described in the specification and/or the drawings of JP Patent Application No. 2013-219209 that claims the priority of the present application.

Advantageous Effects of Invention

The present invention provides a technique that can easily check the orientation of a resistive element such as a shunt resistor.

BRIEF DESCRIPTION OF THE DRAWINGS

FIGS. 6B(a)-6B(e) show steps for manufacturing a shunt resistor.

DETAILED DESCRIPTION OF THE PREFERRED EMBODIMENTS

Hereinafter, a resistive element in accordance with an embodiment of the present invention will be described in detail with reference to the drawings. A shunt resistor is a low-resistance resistor that uses a plate-like or ribbon-like metal material, which has been bent, as a resistor, and has electrodes provided at opposite ends thereof. Shunt resistors are widely used as current-detecting resistors and the like because of their high heat dissipation performance and high current capacity. As an electrode structure of such a shunt resistor, a plated electrode is usually formed over the aforementioned metal material.

Figure 1:
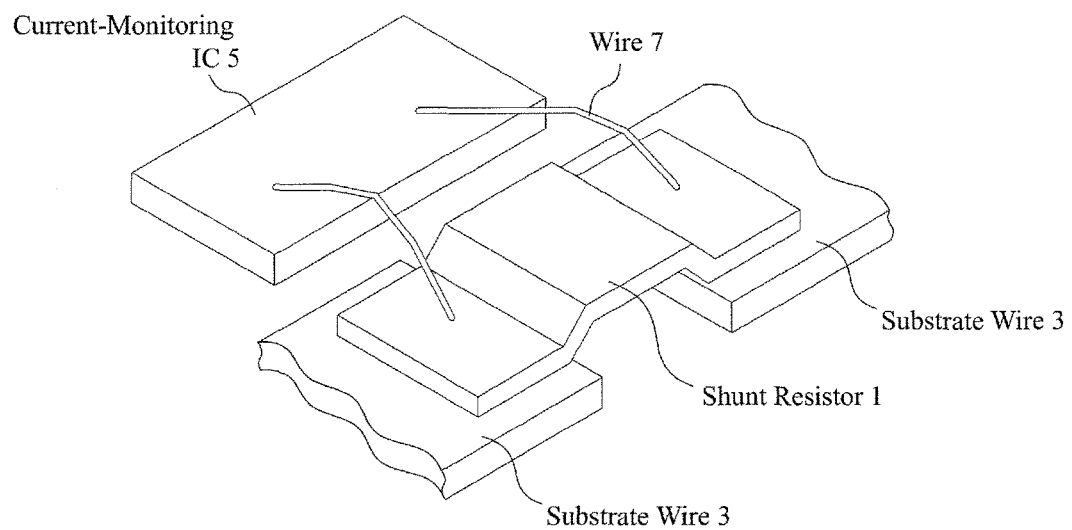
FIG. 1 shows a view in which current is monitored with a shunt resistor that is mounted on substrate wires as an example of a resistive element in accordance with an embodiment of the present invention.
Figure 2:
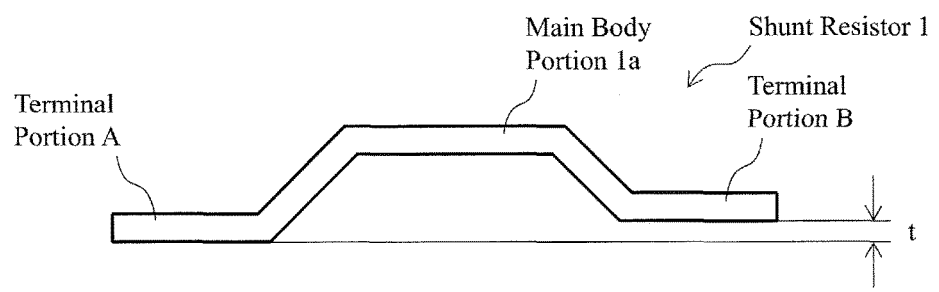
FIG. 2 is a side sectional view of the shunt resistor.
Figure 3:
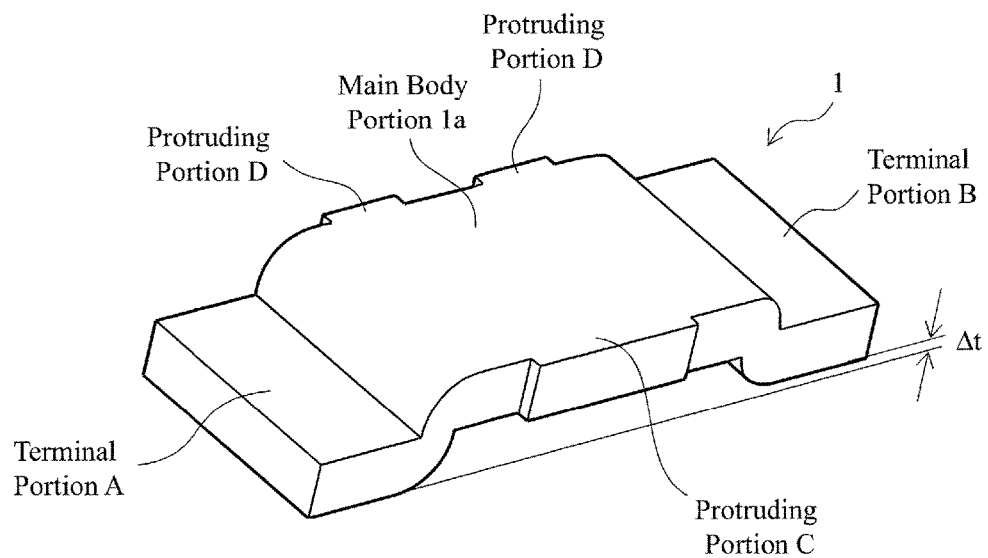
FIG. 3 is a perspective view of the shunt resistor.

FIG. 1 shows a view in which current is monitored with a shunt resistor that is mounted on substrate wires as an example of a resistive element in accordance with this embodiment. FIG. 2 is a side sectional view of the shunt resistor. FIG. 3 is a perspective view of a shunt resistor 1. As shown in FIGS. 1 and 2, the shunt resistor 1 includes a main body portion 1a and a terminal portion A and a terminal portion B that are located at opposite ends of the main body portion 1a in the long-side direction. As shown in FIG. 2, the terminal portion A of the shunt resistor 1 is disposed such that its rear surface is bonded to the upper surface of one of substrate wires 3 (i.e., a contact plane to be in contact with a current line, such as a wire), and the terminal portion B of the shunt resistor 1 is disposed such that its rear surface is bonded to the upper surface of the other substrate wire 3. The terminal portion A and the terminal portion B are connected to a current-monitoring IC 5 with bonding wires 7 and the like. Herein, the lower surface of the terminal portion A and the lower surface of the terminal portion B differ in position by a difference t in height between the substrate wires 3, for example, when the main body portion 1a is placed horizontally. That is, the cross-sectional structure has directionality.

As described above, the shunt resistor 1 has directionality concerning the positions of the terminal portion A and the terminal portion B. Thus, when the shunt resistor 1 is to be mounted as shown in FIG. 1, it is important to know the orientation of the shunt resistor 1.

Thus, as shown in FIG. 3, the shunt resistor 1 in accordance with this embodiment is provided with a protruding portion C that protrudes from at least one side face of the main body portion 1a in a direction that intersects (at a right angle in the drawing) with a direction connecting the terminal portion A and the terminal portion B of the main body portion 1a so that the terminal portion A and the terminal portion B can be easily distinguished. That is, the protruding portion C is provided such that it protrudes in the short-side direction. Protruding portions D will be described later.

Herein, the protruding portion C is provided to allow identification of the orientation of the terminal portions. However, as the orientation of the terminal portion A and the terminal portion B can be identified as long as the shape of the main body portion 1a is changed, it is also possible to use a method of providing a recess and the like, and the method is not specifically limited as long as the directionality can be known from the shape. Further, not only a protruding portion, but any other characteristic shapes may be used. Hereinafter, description will be made of an example in which a protruding portion is provided as a structure to allow identification.

It should be noted that the long-side direction and the short-side direction are the terminologies used for the sake of convenience, and the long-side direction is a direction in which a current flows when a resistor is used, and is not limited by the dimensions.

Figure 4:
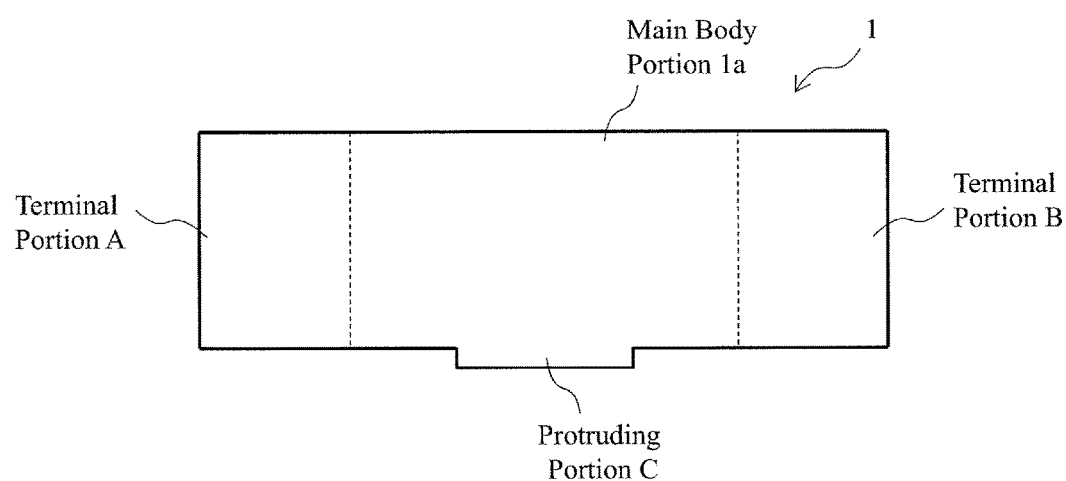
FIG. 4 is a view showing an exemplary configuration of a shunt resistor in accordance with a first embodiment of the present invention.

FIG. 4 is a view showing an exemplary configuration of a shunt resistor in accordance with a first embodiment of the present invention seen from above. The shunt resistor 1 includes a main body portion 1a made of a metal material, terminal portions A and B provided at opposite ends of the main body portion 1a, and a protruding portion C provided on one side portion of the main body portion. Accordingly, even when one terminal portion A and the other terminal portion B have different shapes (structures) and thus have directionality as shown in FIG. 2, it is possible to identify the orientation of the terminal portions A and B from the direction in which the protruding portion C protrudes from the main body portion 1a.

As described above, according to the shunt resistor in accordance with this embodiment, the main body portion 1a is provided with a protruding portion so that the orientation of the terminal portions A and B can be identified based on the protruding direction of the protruding portion. Therefore, it is possible to determine the orientation of the shunt resistor to be mounted on substrate wires and actually mount the shunt resistor using a simple structure.

Next, a second embodiment of the present invention will be described.

Figure 5:
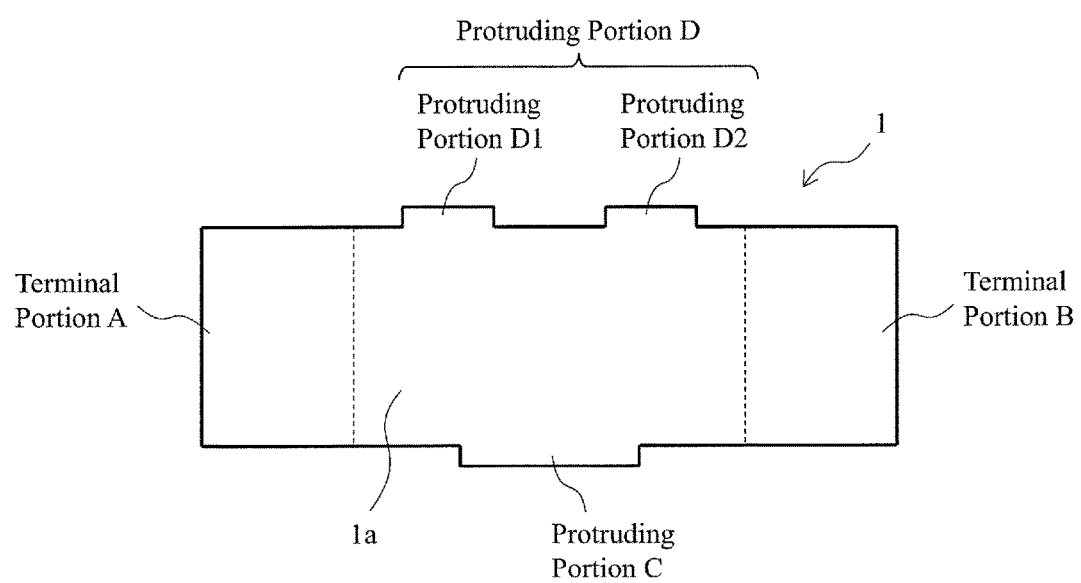
FIG. 5 is a view showing an exemplary configuration of a shunt resistor in accordance with a second embodiment of the present invention.

FIG. 5 is a view showing an exemplary configuration of a shunt resistor in accordance with a second embodiment of the present invention. The shunt resistor 1 includes a main body portion 1a made of a metal material, terminal portions A and B provided at opposite ends of the main body portion 1*a*, a protruding portion C provided on one side portion of the main body portion 1*a*, and a protruding portion D, which has a different protruding shape from the protruding portion C, provided on the other side portion. Accordingly, even when one terminal portion A and the other terminal portion B have different shapes (structures) and thus have directionality as shown in FIG. 2, it is possible to identify the orientation of the terminal portions A and B based on the difference in the protruding shape between the protruding portion C and the protruding portion D.

Next, a method for manufacturing a shunt resistor in accordance with each of the aforementioned embodiments will be described. First, a plate material of Cu, Cu—Ni-based, or Cu—Mn-based metal is used as a plate-shaped (belt-shaped) material for a resistor, for example. Alternatively, a material obtained by forming a Ni—P film over such a metal plate material through electroless plating can also be used.

Figure 6A:
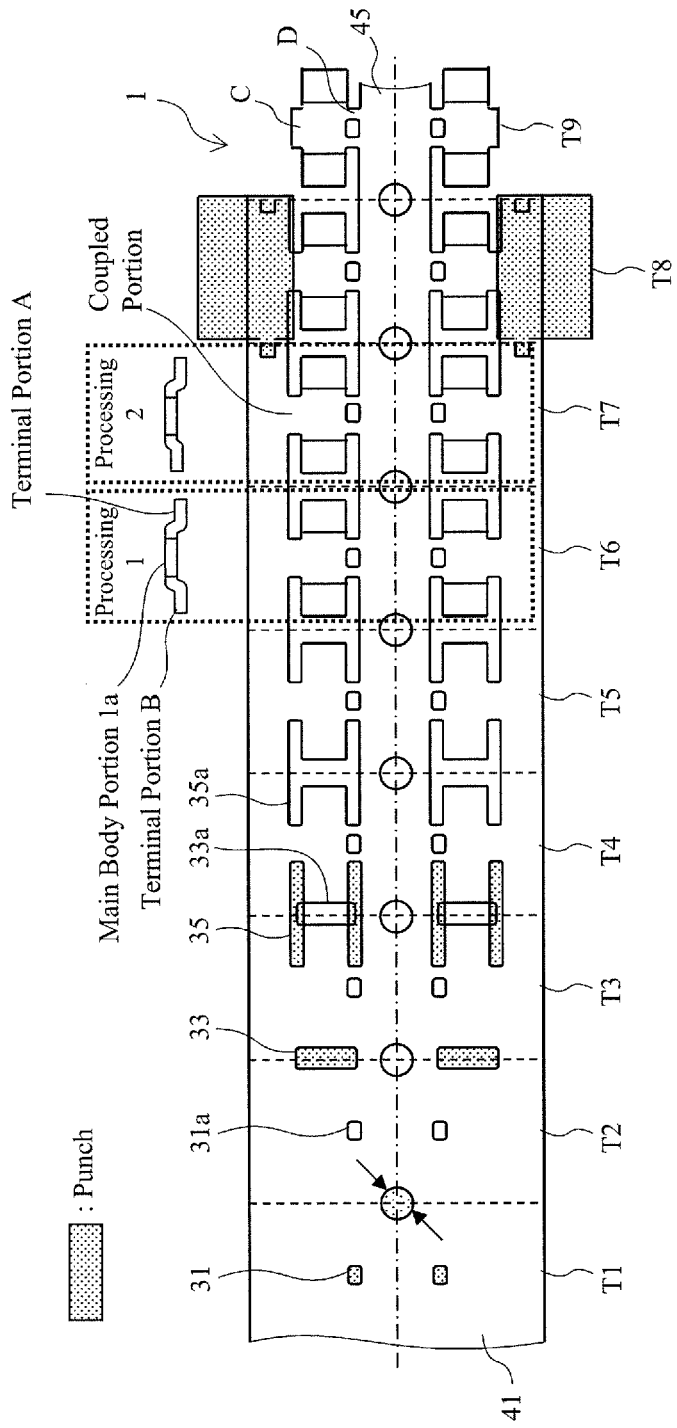
FIG. 6A collectively shows a summary of the steps for manufacturing the shunt resistor in accordance with the second embodiment as an example of a manufacturing method, where drawings shown in T1 to T9 illustrate structures after different steps.

FIG. 6A collectively shows a summary of the steps for manufacturing the shunt resistor in accordance with the second embodiment as an example of a manufacturing method, where drawings shown in T1 to T9 illustrate planar structures in different steps. Meanwhile, FIGS. 6B(a) 6B(e) sequentially show the structures in the manufacturing steps. First, as shown in T1 T2 of FIG. 6A and FIG. 6B(a), a hole 31*a* for forming protruding portions D (D1, D2) later is formed in a sheet 41, which is a hoop-like metal material, using a punch and the like. Although a hoop-like or ribbon-like metal material, which is an elongated plate material, is used as the sheet 41 in FIG. 6A and the like, it is also possible to use a plate-shaped (sheet-like) metal material from which a number of resistors can be produced in an array in the vertical and horizontal directions. Next, as shown in T2 T3 of FIG. 6A and FIG. 6B(b), a plurality of first holes 33*a* for forming the outer rims of the terminal portions A and B in the long-side direction are formed in the sheet (plate-shaped body) 41 in the long-side direction. Accordingly, the end faces of the terminal portions A and B of a single shunt resistor can be defined.

Next, as shown in T4-T5 of FIG. 6A and FIG. 6B(c), the side faces of the terminal portions A, B of the shunt resistor 1 in the short-side direction are defined, and a plurality of second holes 35*a* for forming a protruding portion on one side of the main body portion 1*a* are formed in the long-side direction. Next, as shown in T6 and T7 of FIG. 6A, press working is performed twice (processing 1 and processing 2) to process the sheet into a shape in which the main body portion 1*a* protrudes beyond the terminal portions A and B, thereby forming the main body portion 1*a* and the terminal portions A and B, and then to process the sheet so that the terminal portion A has a level higher than the terminal portion B by t, thereby providing a difference in height between the terminal portion A and the terminal portion B as shown in FIG. 3. It should be noted that in FIG. 6A, two lines of products that include the upper and lower lines are formed, where each product on the upper line has a terminal portion A (with a higher level) on the right side and a terminal portion B (with a lower level than the terminal portion A) on the left side, while each product on the lower line has a terminal portion A on the left side and a terminal portion B on the right side.

On the opposite side faces of the main body portion 1*a*, first and second coupled portions (i.e., a first coupled portion 37*a* and a second coupled portion 37*b* in FIG. 6B(c)) that are coupled to the sheet 41 are formed.

Next, as shown in T8 of FIG. 6A and FIG. 6B(d), the protruding portion C is formed with a press P or the like while the amount of protrusion of the protruding portion C is adjusted. Although the press P is adapted to press a plurality of pieces in FIG. 6B(d), it is also possible to individually press a plurality of pieces as shown in T8 of FIG. 6A. That is, the first coupled portion 37*a* on the outer side of the main body portion 1*a* in the short-side direction is cut to expose an end face and to cut away the outer rim portion of the plate-shaped body 41 in the short-side direction, as well as an opening region of the second hole 35*a* on the outer side in the short-side direction, from the plate-shaped body 41. Then, as shown in T9 of FIG. 6A and FIG. 6B(e), a structure can be obtained in which only the protruding portion D side of the shunt resistor 1 is coupled to the inner side of the sheet (main body) 45. Herein, the protruding portion D is coupled to the inner side of the sheet (main body) 45 via the second coupled portion 37*b* at two points. Thus, when the shunt resistor is cut away from the inner side of the sheet (main body) 45 at the second coupled portion 37*b*, the protruding portion D is formed. The number of the protruding portions D can be adjusted by adjusting the number of the holes 31*a*. Although the hole 31*a* is formed at substantially the center of the second coupled portion 37*b*, if the hole 31*a* is formed at a position off the center, directionality can be identified.

That is, it is possible to expose an end face of the main body portion 1*a* on the inner side in the short-side direction through cutting, and cut away the inner side of the sheet (main body) 45, which is the inner rim portion of the plate-shaped body 41 in the short-side direction, as well as an opening region of the second hole 35*a* on the inner side in the short-side direction, from the plate-shaped body 41.

Figure 7A:
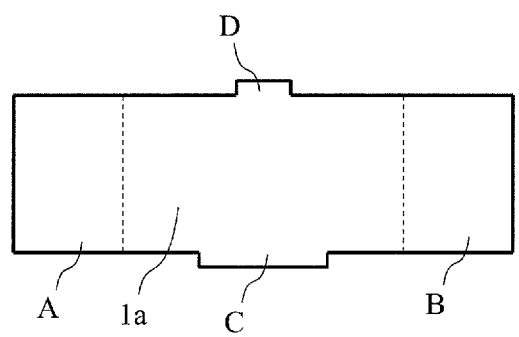
FIGS. 7(a)-7(c) are views showing variations of a shunt resistor with a modified protruding portion.
Figure 7B:
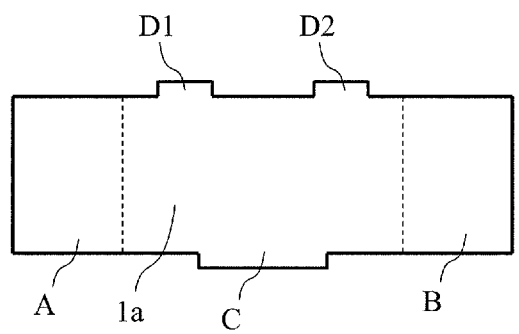
Figure 7C:
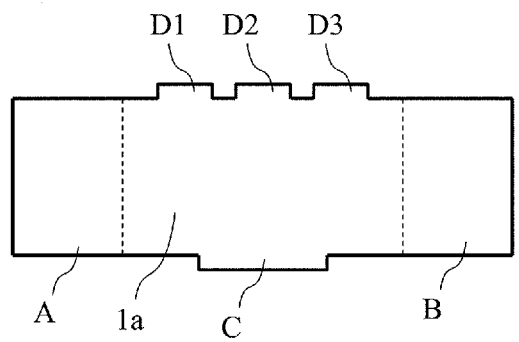

It should be noted that the positions and the numbers of the protruding portions of the shunt resistor can be changed as appropriate as shown in the example of FIGS. 7(*a*)-7(*c*).

Figure 8:
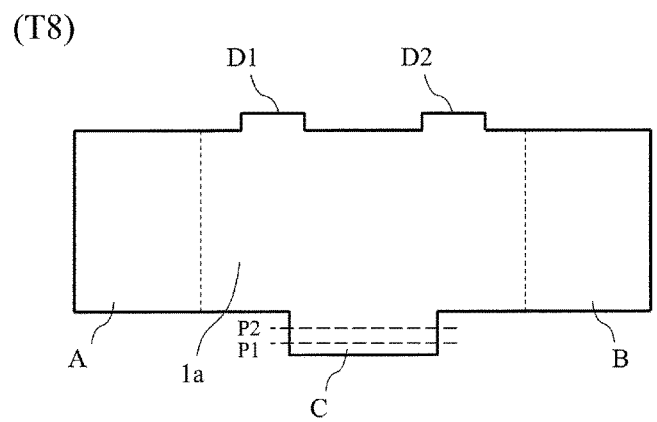
FIG. 8 shows a view in which the resistance of the main body portion of a shunt resistor is adjusted by changing the dimensions of the protruding portion A by cutting the main body portion at one of a position P1 or a position P2 that differ in position in the protruding direction in T8 of FIG. 6A.

As shown in FIG. 8, it is possible to change the dimensions of the protruding portion C by selecting the cut position between the position P1 and the position P2 that differ in position in the protruding direction of the protruding portion C in the cutting step for forming the protruding portion C in T8 of FIG. 6A. Thus, the resistance of the main body portion 1*a* of the shunt resistor can be adjusted. Therefore, it is possible to produce two types of resistors with different resistance values, which include a resistor obtained through cutting at the position P1 and a resistor obtained through cutting at the position P2, from a single sheet 41. In addition, it is also possible to measure the resistance value between the terminal portions A and B before the cutting step and determine a cut position of the first coupled portion 37 for forming the protruding portion C in accordance with the obtained resistance value. In that case, it is preferable to measure a change rate of the resistance value in accordance with a change in the cut position in advance. Alternatively, it is also possible to measure the resistance value of a resistor obtained from a sheet in advance, and then determine a cut position of a first coupled portion 37*a*, which is to be obtained from the same sheet but has not been cut yet, in accordance with the resistance value. It is also possible to adjust the cut position of the second coupled portion 37*b* for forming the protruding portion D, or adjust the cut positions of both the coupled portions 37*a* and 37*b*.

Figure 9:
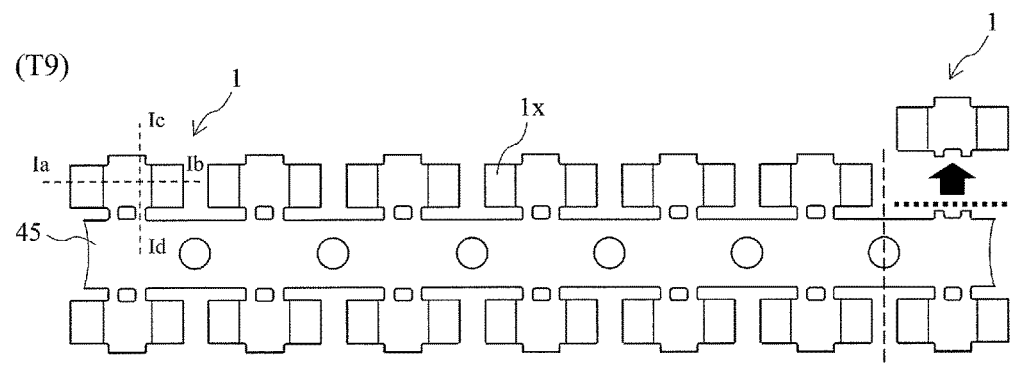
FIG. 9 shows a view in which a resistor is cut away at a protruding portion after a sheet of Cu or the like is covered with Ni—P or the like through electroless plating.
Figure 10:
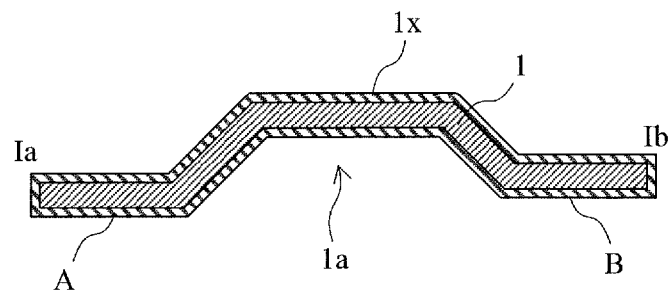
FIG. 10 is a cross-sectional view along line Ia-Ib in FIG. 9.
Figure 11:
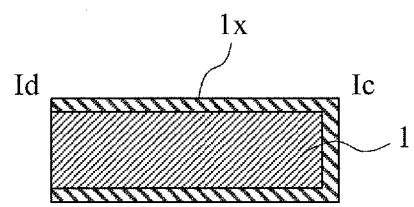
FIG. 11 is a cross-sectional view along line Ic-Id in FIG. 9.

After the termination of the step of T9 in FIG. 6A, the entire surface of the sheet 45 of Cu or the like is covered with Ni—P or the like through electroless plating or the like as shown in FIG. 9, so that a shunt resistor 1 covered with a metal film 1*x* of Ni—P or the like can be produced as shown in FIG. 10 (cross-sectional view along line Ia-Ib in FIG. 9). It should be noted that the metal film is formed while the protruding portion D is coupled to the inner side of the sheet (main body) 45. Thus, a cross-section along line Ic-Id in FIG. 9 after the cutting step has a structure in which an end portion of the protruding portion D is not covered with the metal film 1x as shown in FIG. 11. However, as the metal film is formed with the terminal portions A and B separated from the inner side of the sheet (main body) 45, the terminal portions A and B are covered with the metal film 1x. Thus, the metal film 1x can be formed at the mount portions and the bonding wire connection portions, and plating can be performed in a sheet state. Accordingly, as a plurality of shunt resistors can be collectively plated at once before the cutting step, the steps can be simplified. It should be noted that the metal film 1x may also be formed by forming a Ni film or the like through electroless plating.

As shown in FIG. 6A, when at least one hole 31a is formed at a position to be connected to second opening regions on the inner side of the sheet (main body) 45, which form the second holes 35a paired in the short-side direction, in the long-side direction, it becomes possible to adjust the number of, among the protruding portions of the main body portion 1a, the protruding portions D that are formed on a side portion of the main body portion 1a and protrude in the short-side direction in cutting away the shunt resistor 1 from the inner edge portion in the short-side direction.

In addition, when the protruding shape of a side portion of a protruding portion, which protrudes in the short-side direction, of the main body portion 1a is allowed to be identified from the processed shape of the plate-shaped body 41 in the long-side direction between the second holes 35a that are paired in the short-side direction, it becomes possible to, by providing a single hole 31a between the second holes 35a on the inner side as shown in FIG. 6B(a) to (c), set the number of protruding portions to 1 on one side and to 2 on the other side as shown in FIG. 7(b).

As described above, according to the manufacturing method in accordance with this embodiment, it is possible to easily identify the orientation of a shunt resistor with two terminal portions seen from above.

It is also possible to set the arrangement of the first and second protruding portions to be opposite, and cut the second protruding portion first.

Figure 12A:
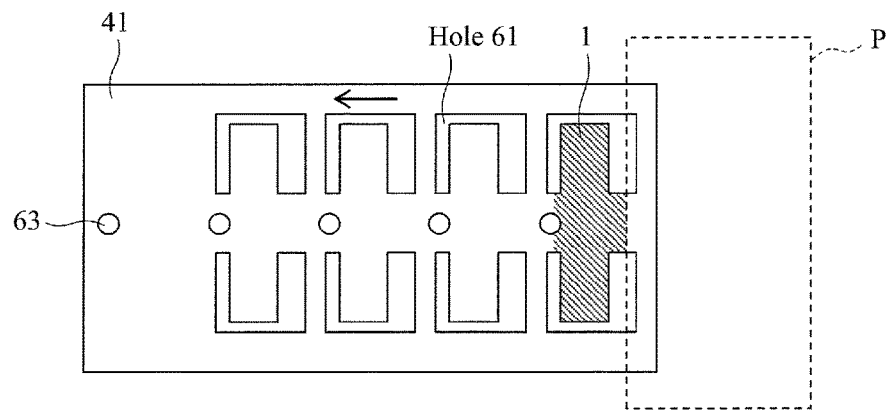
FIGS. 12(a) and 12(b) show views in which a shunt resistor is formed by conducting cutting in a direction different from the cutting direction shown in FIGS. 6A and 6B.
Figure 12B:
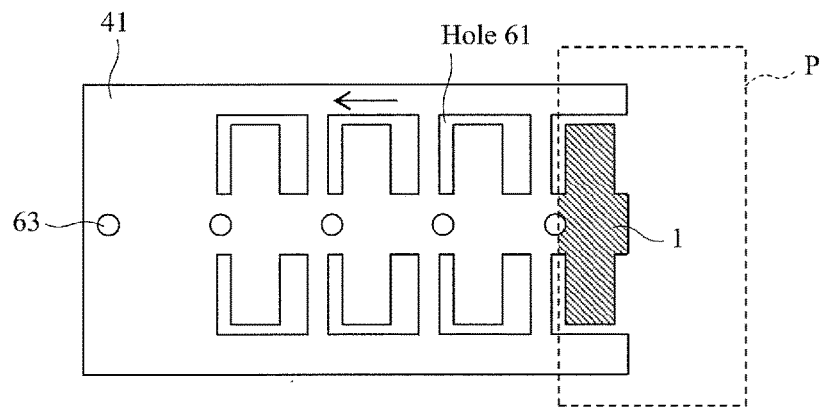

Next, a third embodiment of the present invention will be described with reference to the drawings. FIGS. 12(a) and 12(b) show views in which a shunt resistor is formed by conducting cutting in a direction different from the cutting direction shown in FIG. 6A. Two opposite U shaped holes 61 that define terminal portions, and a hole 63 provided therebetween along the direction of tip ends of the U shapes are formed, and then, cutting is conducted with a press P. Then, a shunt resistor 1 (hatched portion) with the same configuration as those in the first and second embodiments can be produced.

As described above, according to each of the embodiments of the present invention, the shunt resistor 1, which has the terminal portions A and B at the opposite ends of the main body portion 1a, has a protruding portion that is formed at least on one side of the main body portion 1a and protrudes from the main body portion 1a so that the orientation of the shunt resistor can be identified. Accordingly, even when a solid with a reduced size has terminal portions that have been formed to have a difference in height therebetween, the orientation of the solid to be mounted can be accurately determined, and the steps can be simplified.

Further, as the resistance value can be adjusted by adjusting the size of the protruding portion, a high-precision resistor can be produced.

In the aforementioned embodiments, configurations and the like shown in the attached drawings are not limited thereto, and can be changed as appropriate within the range that the advantageous effects of the present invention can be exerted. Further, such configurations can be changed as appropriate without departing from the scope of the object of the present invention.

Each feature of the present invention can be freely selected, and an invention that includes the freely selected feature also falls within the scope of the present invention.

INDUSTRIAL APPLICABILITY

The present invention is applicable to resistors.

All publications, patents, and patent applications that are cited in this specification are all incorporated by reference into this specification.

What is claimed is:

1. A shunt resistor comprising:
   a main body plate extensive in a first plane and having longitudinal ends opposite to each other and lateral ends opposite to each other, wherein the main body has a predetermined resistance across the longitudinal ends;
   first and second terminal plates shaped similarly to each other and configured to extend in opposite directions, respectively, from the longitudinal ends of the main body portion, wherein the first and second terminal plates extend, respectively, in second and third planes both parallel to the first plane, and the third plane is located between the first and second plane;
   a protruding portion protruding from at least one of the lateral ends of the main body; and
   a metal film coated over the main body portion, except a distal end of the protruding portion which is free of coating, wherein
   the first and second terminal plates are configured for electrical connection to measure a voltage generated across the longitudinal ends of the main body plate by an electrical current flowing through the predetermined resistance of the main body plate, and the main body plate dispenses with any electrical connection to measure a voltage generated across any longitudinal range of the main body plate between the longitudinal ends of the main body plate.

2. The shunt resistor according to claim 1, wherein
   the lateral ends of the main body portion have a first protruding portion and a second protruding portion protruding, respectively, therefrom, and
   the first protruding portion and the second protruding portion are formed in different shapes.

3. The shunt resistor according to claim 2, wherein one of a distal end of the first protruding portion protruding from one lateral end of the main body portion or a distal end of the second protruding portion protruding from the other lateral end of the main body is not coated with the metal film.

4. A method for manufacturing a shunt resistor, the shunt resistor including a main body plate having longitudinal ends and lateral ends, first and second terminal plates extending in opposite directions, respectively, from the longitudinal ends of the main body plates, and a protruding portion protruding from at least one of the lateral ends of the main body plate, the method comprising:

preparing a base plate made of a metal material;
forming, in the base plate, laterally elongated holes for defining longitudinal distal ends of the first and second terminal plates
forming, in the base plate, longitudinally elongated holes for defining lateral ends of the shunt resistances, wherein forming, in the base plate, longitudinally elongated holes for defining lateral ends of the shunt resistances comprises forming a first bridge between two adjacent longitudinally elongated holes for defining the protruding portion on one of the lateral ends of a respective main body plate;
pressing the base plate so that the main body plates lie in a first plane and the first and second terminal plates lie, respectively, in second and third planes both parallel to the first plane, and the third plane being located between the first and second planes;
cutting the base plate along the other of the lateral ends of the main body plates;
coating the main body plates with a metal film; and
cutting the base plate and the protruding portions along said one of the lateral ends of the main body plates on which the projection portions are formed, wherein the main body plates are coated with the metal film, except distal ends of the protruding portions which are free of coating,
wherein the main body plate has a predetermined resistance across the longitudinal ends of the main body, and the first and second terminal plates are configured for electrical connection to measure a voltage generated across the longitudinal ends of the main body plate by an electrical current flowing through the predetermined resistance of the main body plate, and further wherein the main body plate dispenses with any electrical connection to measure a voltage generated across any longitudinal range of the main body plate between the longitudinal ends of the main body plate.

5. The method according to claim 4, wherein cutting the base plate and the protruding portions along said one of the lateral ends of the main body plates comprising adjusting a height of the protruding portions to adjust a resistance value of the main body plate equal to the predetermined resistance, wherein the protruding portion is cut.

6. The method according to claim 5, wherein forming, in the base plate, longitudinally elongated holes comprises forming a second bridge between two adjacent longitudinally elongated holes for defining the protruding portion on the other of the lateral ends of a respective main body plate.

7. The method according to claim 6, wherein forming, in the base plate, longitudinally elongated holes comprises forming second and third bridges for defining a pair of the protruding portions on the other of the lateral ends of a respective main body plate.

* * * * *